United States Patent [19]

Shambroom et al.

[11] Patent Number: 4,539,835
[45] Date of Patent: Sep. 10, 1985

[54] CALIBRATION APPARATUS FOR CAPACITANCE HEIGHT GAUGES

[75] Inventors: John R. Shambroom, Lexington, Mass.; Alan P. Sliski, Lincoln, Md.

[73] Assignee: Control Data Corporation, Minneapolis, Minn.

[21] Appl. No.: 589,902

[22] Filed: Mar. 14, 1984

Related U.S. Application Data

[63] Continuation-in-part of Ser. No. 546,760, Oct. 28, 1983.

[51] Int. Cl.³ ............................................. G01B 21/16
[52] U.S. Cl. .................................... 73/1 J; 324/61 R; 324/74; 356/356
[58] Field of Search ................. 73/1 J, 1 H; 324/74, 324/61 R, 61 P; 356/355, 356

[56] References Cited

U.S. PATENT DOCUMENTS

| | | | |
|---|---|---|---|
| 3,409,774 | 11/1968 | Dykeman | 73/1 J |
| 3,523,735 | 8/1970 | Taylor | 356/356 |
| 3,986,109 | 10/1976 | Poduje | 324/61 P |
| 4,461,569 | 7/1984 | Corbett | 324/61 R |

*Primary Examiner*—S. Clement Swisher
*Attorney, Agent, or Firm*—Edward P. Heller, III; Joseph A. Genovese

[57] ABSTRACT

In an electron beam lithography apparatus a capacitance height gauge is used to determine the distance between a reticule and electron optics. In order to calibrate the capacitance gauge an optical interferometer, including a mirror are mounted on the same axis as the capacitance gauge. The mirror is moved a predetermined distance so that the movement distance measured by the capacitance gauge and the interferometer can be compared.

11 Claims, 16 Drawing Figures

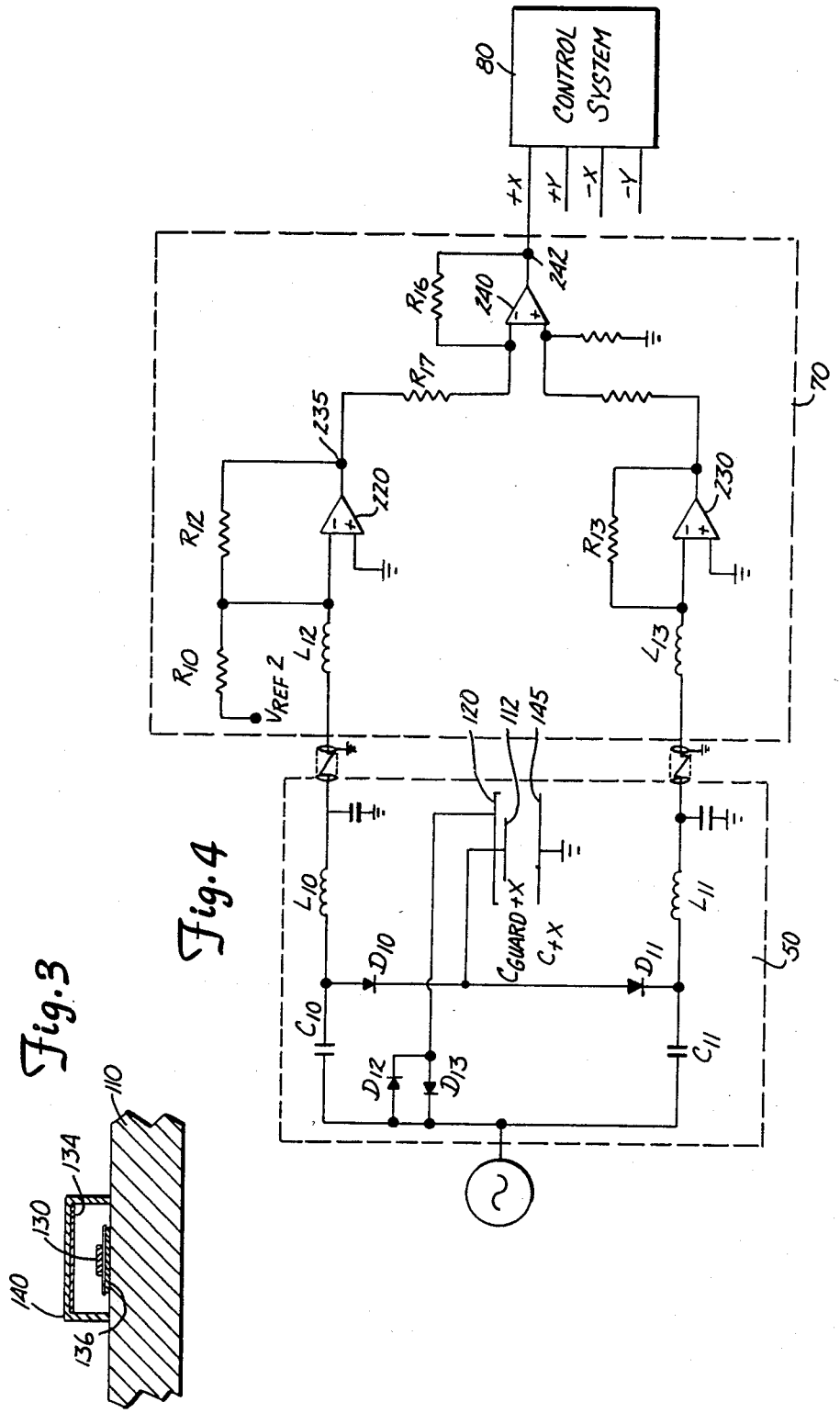

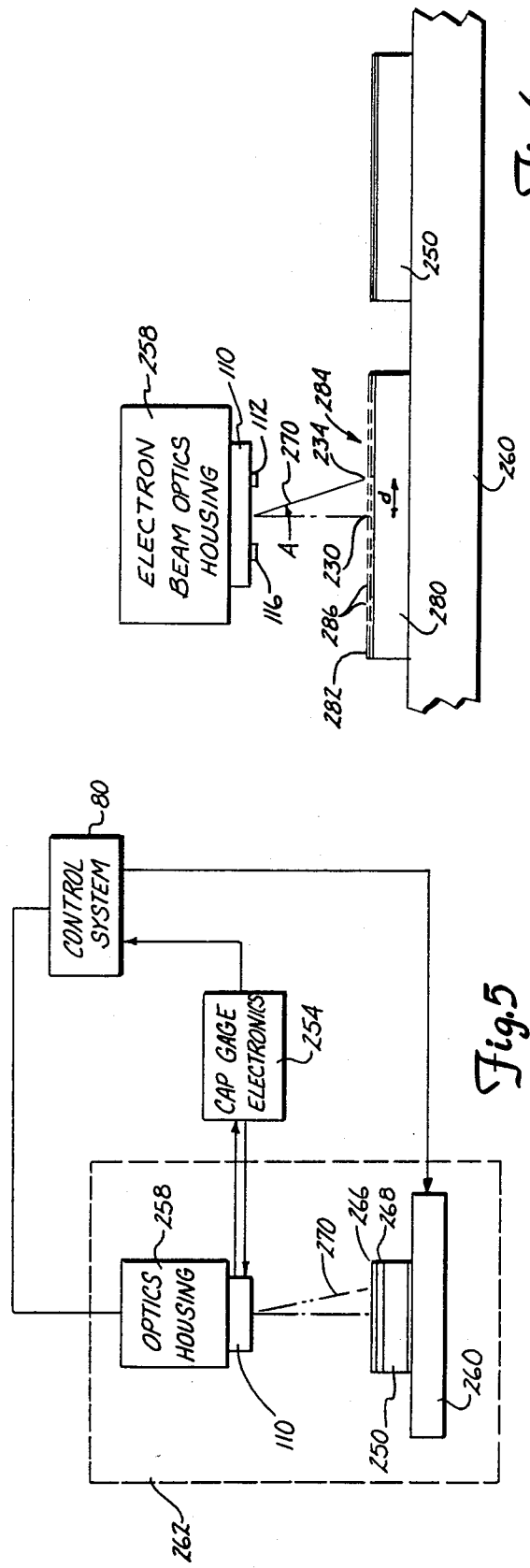
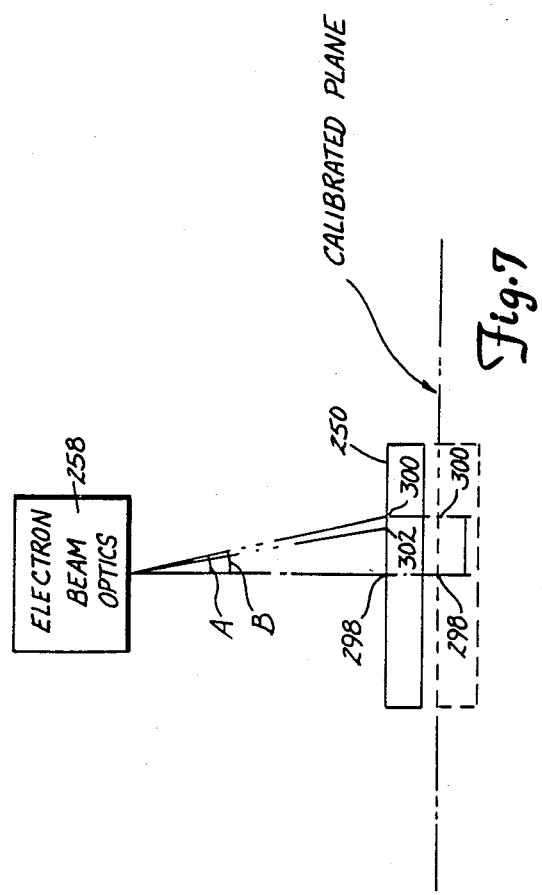

CALIBRATION APPARATUS FOR CAPACITANCE HEIGHT GAUGES

CROSS REFERENCE TO RELATED APPLICATION.

This is a continuation-in-part of prior application Ser. No. 546,760, filed on Oct. 28, 1983.

BACKGROUND

There is a great need for high accuracy height measuring gauges for a wide variety of applications. One such application is in determining the position of a reticle in an electron beam lithography apparatus.

Electron beam lithography is rapidly becoming the method of choice for exposing ultrahigh accuracy reticles in the production of very large scale integrated circuits. An electron beam lithography apparatus typically includes an electron beam optics housing positioned over a vacuum chamber in which a reticle is installed. The reticle is a glass plate covered by a layer of chromium, with a layer of electron beam resist deposited over the layer of chromium. The reticle is mounted on a stage which moves the reticle in the X and Y directions under the control of the control system while the electron beam writes on, or exposes, the beam resist layer to produce the desired circuit pattern on the reticle. The control system not only moves the reticle to the desired X,Y coordinate for the stage position being exposed, but also, controls the beam deflection angle to control the point on the reticle at which the electron beam strikes.

In the past one of the more difficult problems in this art has been to determine the precise position of the reticle with respect to the electron beam optics. The precise position of the reticle must be determined in order to properly deflect the electron beam in order to accurately write on the reticle. It is extremely important that any system used to determine the position of the reticle be a vacuum compatible, compact, and noncontacting.

In addition, accurate methods for calibrating capacitive height gauges are needed. In the past, capacitance gauges have been calibrated by means of mechanically measured distances, such as by means of micrometer measurements.

SUMMARY

The present invention comprises a highly accurate capacitance height gauge which is applied in the presently preferred embodiment in a reticle position detection system for an electron beam lithography apparatus.

The capacitive height gauge circuitry includes a hybrid circuit substrate which carries four measuring capacitor circuits and two reference capacitor circuits. The driven plates of the four measuring capacitors are disposed on the bottom of the substrate opposite to the object surface to be measured. The driven plates of the two reference capacitors are disposed on the top surface of the substrate under caps which support oppositely disposed grounded capacitor plates at a nominal distance from the driven plates. The object surface comprises the grounded plate for the four measuring capacitors. The reference capacitors provide voltage regulation to ensure that a stable signal drives the measuring capacitors. The reference capacitors also set zero points for the measurements from the four measuring capacitors. These zero points are set at the nominal distance from the measuring capacitor sensors. The four measuring capacitors provide readings with respect to the object surface to determine the position of the object surface with respect to the nominal zero points. This information can be used by a suitable control system to manipulate the object surface or tools used to work on the surface in response to the position information as appropriate to the task being performed.

In the presently preferred embodiment, the capacitance height gauge is employed as an integral part of a reticle position detection system for an electron beam lithography apparatus. The "normal angle" of deflection of the electron beam is first calibrated with respect to a calibration plate. The four measurement sensors of the capacitance gauge are then utilized to detect the position of the calibration plate and to input this position information into the electron beam control system to define the plane which the calibration plate lies in which is denoted as the "calibrated plane" for the reticle. The reticle is then moved under the electron beam optics. Readings are taken from the four measuring sensors of the capacitance gauge to detect the position of the reticle. This reticle position information is then also input to the control system. The control system determines the deviation, if any, of the reticle from the calibrated plane and appropriately adjusts the deflection angle of the electron beam in response to the detected deviation to write at the desired point of the reticle with a very high degree of accuracy.

In addition, a calibration apparatus for capacitance height gauges is disclosed which is far superior to the present mechanical measurement methods.

Having described the invention in its presently preferred embodiment in brief overview, the advantages, features and novel aspects of the invention will become apparent from the more detailed description of the invention which follows taken in conjunction with the accompanying figures.

BRIEF DESCRIPTION OF THE FIGURES

FIG. 3 shows an elevational view of the linearization of the electric field lines of the driven plate of reference capacitor $C_{Ref.\ 1}$ under the influence of the guard ring.

FIG. 4 shows a simplified circuit diagram of the measuring capacitor circuitry and measurement signal generation circuitry for the +X sensor.

FIG. 5 is a schematic diagram showing the environment of the capacitance height gauge as applied in a reticle position detection system for an electron beam lithography apparatus.

FIG. 6 shows the calibration of the electron beam using a calibration plate.

FIG. 7 shows the adjustment made by the control system to the deflection angle where the reticle is positioned above the calibrated plane.

DESCRIPTION OF THE PRESENTLY PREFERRED EMBODIMENT OF THE INVENTION

Figure 1B:
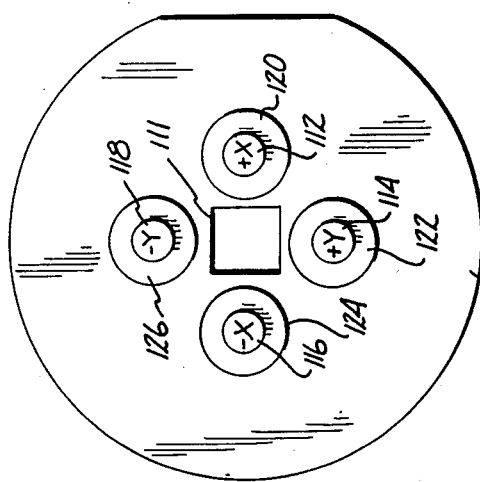
FIG. 1B shows a bottom view of the hybrid circuit substrate.
Figure 1C:
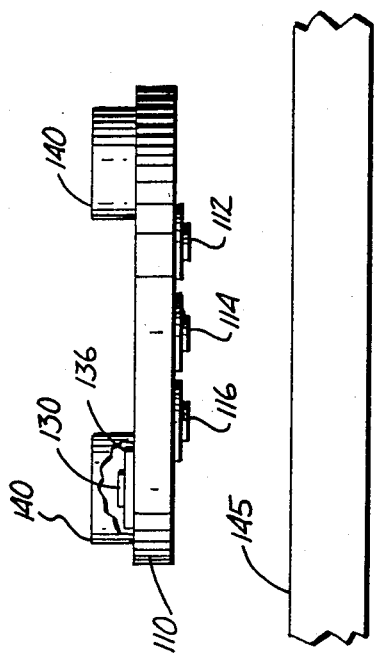
FIG. 1C shows an elevational view of the hybrid circuit substrate of the capacitance height gauge overlying the object surface.
Figure 1A:
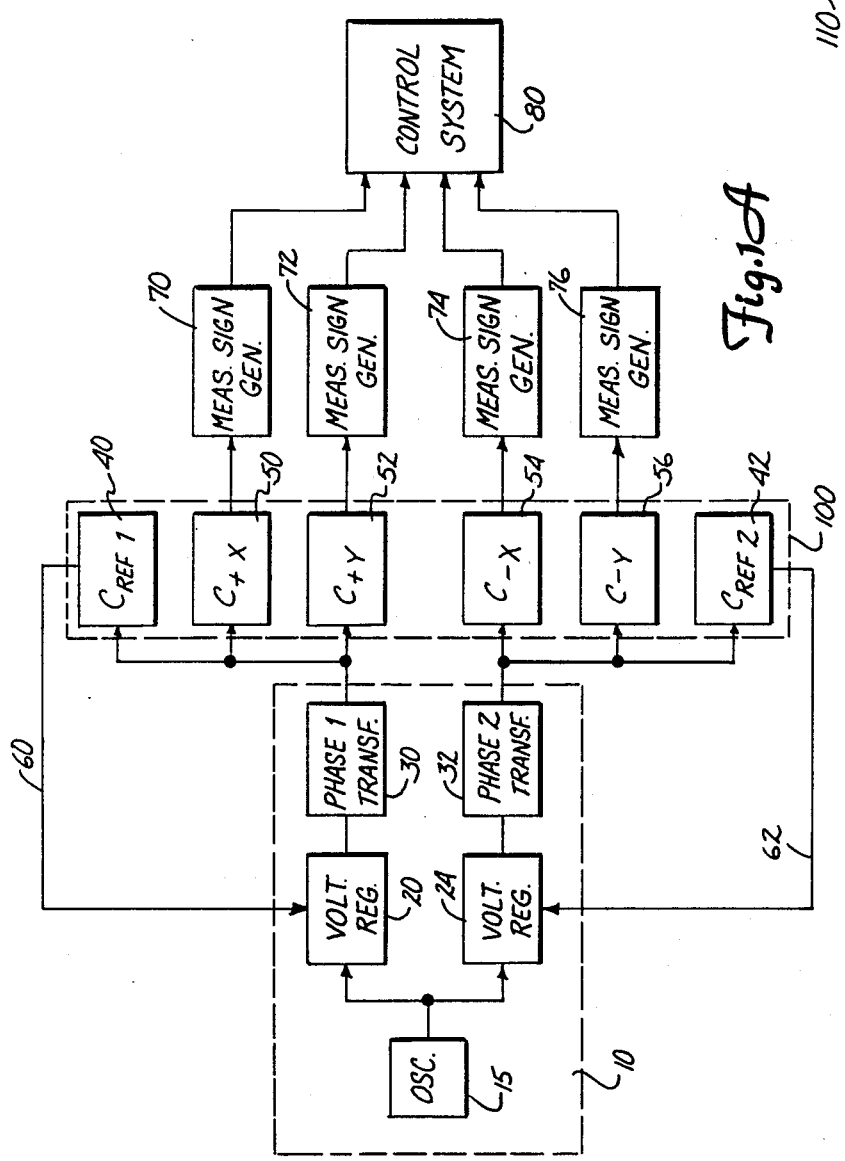
FIG. 1A shows a schematic overview of the capacitance height gauge.

FIG. 1A shows a schematic diagram of the capacitance height gauge circuitry of the present invention.

Figure 8:
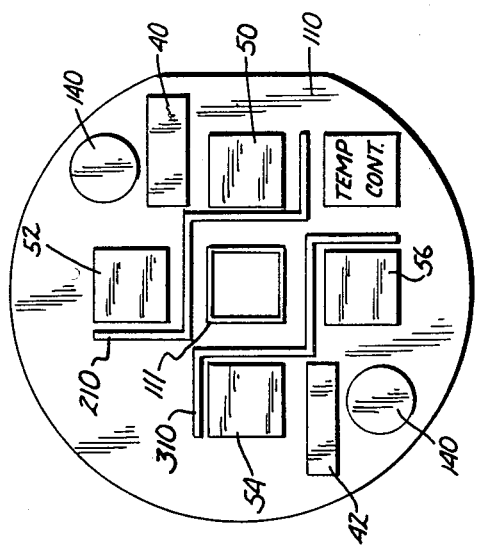
FIG. 8 shows a top view of the hybrid circuit substrate of the capacitance height gauge.

The signal source circuitry 10 includes an oscillator 15 which provides a sinusoidal signal. The sinusoidal signal is split between a pair of voltage regulating circuits 20, 24. The upper signal goes through a phase 1 transformer 30 while the lower signal goes through a phase 2 transformer 32 to generate 180° out of phase signals. Both of these driving signals are fed to hybrid circuitry carried on a substrate (later described) which overlies the object surface being measured. The hybrid circuitry is comprised of reference capacitor circuitry 40, 42 for $C_{Ref.1}$ and $C_{Ref.2}$, and measuring capacitor circuitry 50, 52, 54, 56 for the $C_{+X}$, $C_{+Y}$, $C_{-X}$ and $C_{-Y}$ measuring capacitors. The hybrid circuit substrate 110 is shown in FIGS. 1B, 1C and 8. FIGS. 1B and 1C show that only the +X, +Y, −X and −Y sensors 112, 114, 116, 118 and their associated guard rings 120, 122, 124, 126 are disposed on the bottom of the substrate opposite to the object surface to be measured. The remainder of the bottom surface is ground plane. FIG. 1C shows that both reference capacitors $C_{Ref.1}$ and $C_{Ref.2}$ are disposed on the top of substrate 110. $C_{Ref.1}$ and $C_{Ref.2}$ are comprised of driven plates 130 and oppositely disposed ground plates 134, which are disposed on the internal surface of the caps 140 at a fixed nominal distance from driven plates 130. See FIG. 3. The measuring capacitors are comprised of +X, +Y, −X, −Y driven sensor plates 112, 114, 116, 118 and a grounded plate comprised of the object surface 145 to be measured. See FIG. 1C. $C_{Ref.1}$ and $C_{Ref.2}$ include feedback loops 60, 62 to regulate the voltage of the oscillator to provide a stable signal to the measuring capacitors 50, 52, 54, 56. See FIG. 1A. The $C_{Ref.1}$ and $C_{Ref.2}$ circuits 40, 42 also assist in providing nominal zero points for each of the measuring capacitors as will later be explained more fully. The outputs of measuring capacitor circuits 50, 52, 54, 56 are coupled to associated measurement signal generating circuitry 70, 72, 74, 76 to provide signals to the control system 80 indicating the position of the object surface 145 with respect to the four sensors 112, 114, 116, 118.

The $C_{+X}$ and $C_{+Y}$ circuits 50, 52 and $C_{-X}$ and $C_{-Y}$ circuits 54, 56 are driven by 180° out of phase signals to ensure that there is no net current flow through the object surface 145 to ground. This feature may be important where object surface 145 is a reticle in an electron beam lithography apparatus as will be explained later on.

Figure 2:
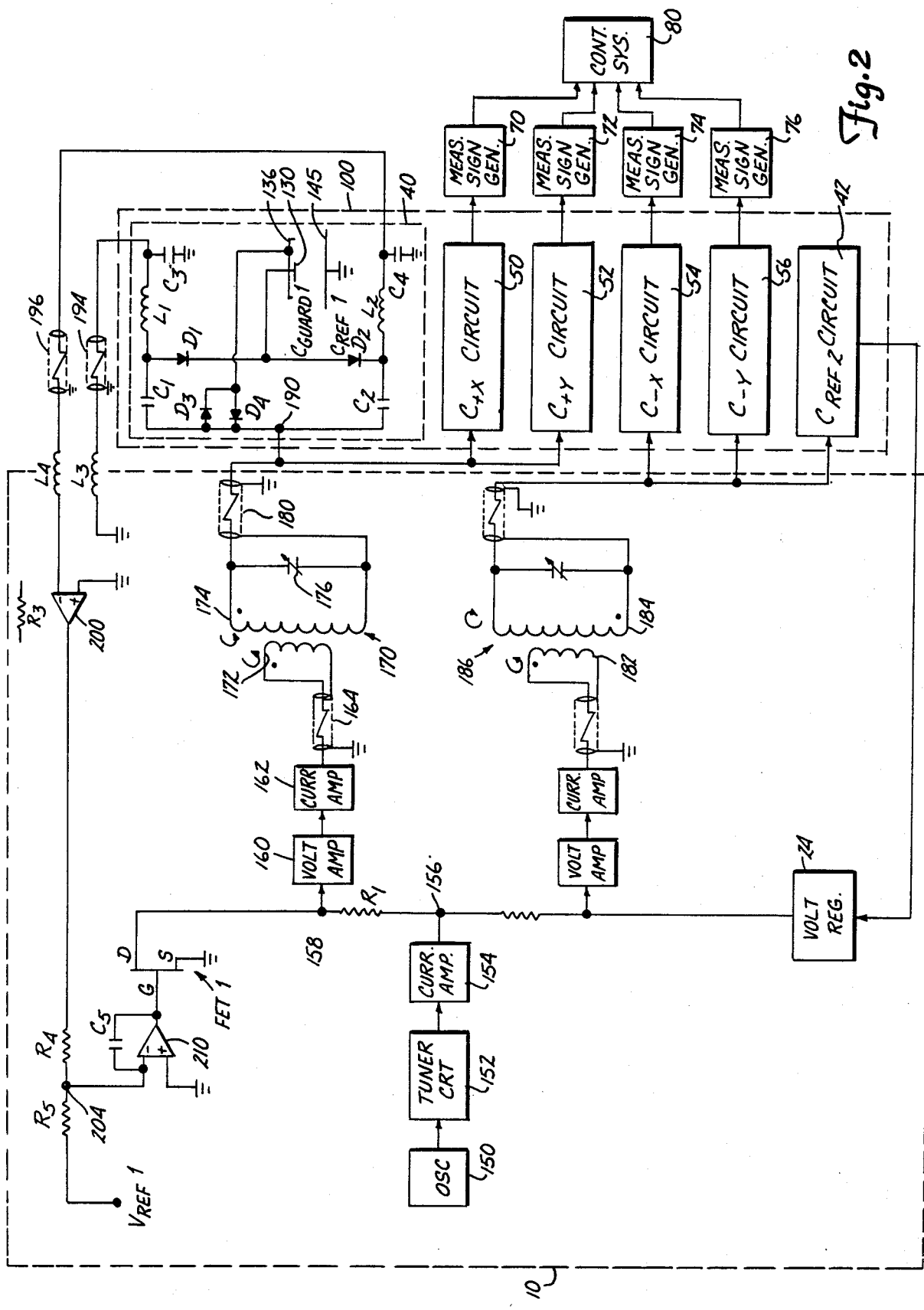
FIG. 2 shows the oscillator circuitry and other circuitry driving the reference capacitor $C_{Ref.\ 1}$ including the reference capacitor feedback loops which stabilize the driving signal of the gauge.

Having described the capacitive height gauge in brief overview, reference is now made to FIG. 2 which shows the signal source circuitry 10 and the circuitry 40 associated with $C_{Ref.1}$ in greater detail. This circuitry provides a clean, symmetric, sinusoidal driving signal to the measuring capacitors as will now be explained.

With reference to FIG. 2, a TTL programmable oscillator 150 generates a high frequency square wave signal which is converted by the tuned circuit 152 into a sinusoidal signal. The signal undergoes a unity voltage gain, current amplification at amplifier 154 and is split at node 156 between the two symmetrically arranged circuits shown in the upper and lower half of the figure. To simplify the description of the circuitry, only the upper portion of the circuitry will be described initially. The signal flows upwardly through $R_1$ and through the FET 1 to ground. FET 1 together with $R_1$ comprise a voltage divider. The resistance of FET 1 varies with its gate signal as will later be explained more fully. From node 158 the signal goes through a voltage amplification at amplifier 160 and another unity voltage gain, current amplification at amplifier 162. The signal is then input over a transmission line 164 to the primary coil of a step-up transformer 170 which is tuned to the oscillator frequency by a variable capacitor 176 connected in parallel with the secondary coil 174. The transformer 170 acts as a band pass filter and a low distortion, geometrically symmetric, sinusoidal signal at the oscillator frequency is thereby produced and transmitted over a transmission line 180 to the hybrid substrate circuitry 40 associated with reference capacitor $C_{Ref.1}$ and the measuring circuitry 50, 52 associated with measuring capacitors $C_{+X}$, $C_{+Y}$, respectively. The circuit 40 for $C_{Ref.1}$ will be described first. Ignoring diodes $D_3$ and $D_4$ and the associated guard ring 136 for the moment, the signal is split at node 190 and passes through DC blocking capacitors $C_1$ and $C_2$. Diodes $D_1$ and $D_2$ are connected between capacitors $C_1$ and $C_2$ in a half wave rectifier arrangement. Reference capacitor $C_{Ref.1}$ is connected between diodes $D_1$ and $D_2$. The plates of $C_{Ref.1}$ are separated by a fixed distance which is equal to the "nominal distance". The nominal distance is the desired distance between sensor plates 112, 114, 116, 118 of the measuring capacitors and object surface 145. The driven plate 130 of $C_{Ref.1}$ is supported on the upper surface of substrate 110 while grounded plate 134 is supported on the interior surface of ceramic cap 140 which is secured to substrate 110 over driven plate 130 as shown in FIG. 3. Inductors $L_1$ and $L_2$ are connected between $C_1$ and $D_1$, and $C_2$ and $D_2$, respectively, as shown. Filter capacitors $C_3$ and $C_4$ are connected between $L_1$ and $L_2$, respectively, and ground. The signal from coil $L_1$ leaves the hybrid circuit via a shielded coaxial cable 194 and is grounded through a coil $L_3$. The signal from coil $L_2$ leaves the hybrid circuit via a shielded coaxial cable 196 and is connected through a coil $L_4$ to the inverting input of transresistance amplifier 200. Transresistance amplifier 200 has a grounded noninverting input and a feedback resistor $R_3$ as shown.

Diodes $D_1$ and $D_2$ are connected in a half wave rectifier arrangement, as noted, so that one diode is "off" while the other diode is "on" and vice versa. As the sinusoidal input signal increases from its maximum negative value to its maximum positive value, $D_1$ is forward biased and conducts to charge capacitor $C_{Ref.1}$. Conversely, as the signal falls from its maximum positive value to its maximum negative value, $D_2$ is forward biased to drain the charge on capacitor $C_{Ref.1}$. We use the current produced in $L_2$ by the discharging of capacitor $C_{Ref.\,1}$ to regulate and stabilize the signal supplied to the measuring capacitors $C_{+X}$ and $C_{+Y}$ as will become apparent. We have grounded the signal passing through $L_1$ in that for the purpose of voltage regulation we need only to monitor the $L_2$ current.

As $C_{Ref.\,1}$ discharges through $D_2$, $C_2$ blocks all DC current and passes the AC component so that a very small DC current passes through coil $L_2$. $L_2$ is a large coil on the order of 470 microhenries to block the AC component of the current. Any small remaining AC component of the current is filtered out by filter capacitor $C_4$. The small DC current passes from coil $L_2$ through coil $L_4$ and is converted by transresistance amplifier 200 into a voltage representative of the current through $L_2$. The current through $L_2$ which is input to transresistance amplifier 200 is multiplied by the value of resistance $R_3$ to generate the output voltage. This output voltage is then imposed across resistor $R_4$ and produces a current $I_{R4}$ flowing to the right out of node 204. A +7 volt reference voltage is imposed on the resistor $R_5$ to produce a current flowing left to right into node 204 in FIG. 2.

It has been previously mentioned that the gate signal to FET 1 controls the drain to source resistance of the FET. If we assume as an initial condition that just before start-up the circuit power is "on" but the oscillator is "off", the 7 volt reference voltage will be applied across $R_5$ with zero voltage being applied across $R_4$. Consequently, a maximum current will be applied through $R_5$ to the inverting input of differential amplifier 210 and differential amplifier 210 will have its maximum negative output of −15 volts, for example, which will shut FET 1 "off" and present a maximum resistance to ground. Consequently, the current flow through, and voltage drop across, $R_1$ will be the minimum and the voltage at node 158 will be a maximum. If we assume that $R_5 = 35$ K ohms and that $V_{Ref.\,1} = 7$ volts, then $I_{R4} = 200$ microamperes flowing through $R_5$ into the inverting pin just before start-up.

Just after start-up this maximum voltage at node 156 will produce maximum current flow through $L_2$ and to the right from node 204 through $R_4$. The current flow through $R_4$ will initially exceed the 200 microampere current through $R_5$ which will make the output of differential amplifier 210 become less negative and rise to −10 volts, for example. The resistance of FET 1 will accordingly drop proportionately reducing the voltage at node 158 and therefore the current through $L_2$ and $R_4$. This cycle will repeat itself until the current flowing from node 210 through $R_4$ equals the 200 microampere current flowing through $R_5$ into node 210. At this point zero current will flow into the inverting input of differential amplifier 210 and the system will consequently lock.

We know $I_{R5}$ is constant at 200 microamperes as calculated above. To make $I_{R4}$ equal to 200 microamperes, if we assume $R_4 = 20$ K ohms, a voltage of $V_{R4} = I_{R4}R_4 = (-200 \text{ microamperes})(20 \text{ K ohms}) = -4$ volts must be imposed across $R_4$ to lock the system. Consequently, the output of transresistance amplifier 200 must be −4 volts at this point. We have already noted that the output of transresistance amplifier 200 is the product of $R_3$ and the input current $I_{L2}$. Consequently, $I_{L2} = V_{TR1}R_3$, and if we assume that $R_3 = 50$ K ohms, then $I_{L2} = -4 \text{ volts}/50 \text{ K ohms} = -80$ microamperes. Therefore the system stabilizes when the current through $L_2 = -80$ microamperes for the illustrative parameters used. Note that this −80 microampere current through $L_2$ corresponds to the capacitance of $C_{Ref.\,1}$ which has a plate separation of the nominal distance. The current through $L_2$ is denoted the reference capacitor signal for $C_{Ref.\,1}$. The $C_{Ref.\,1}$ circuit 40 together with the signal source circuit 10, thus, together stabilize the driving signal supplied to the $C_{+X}$ and $C_{+Y}$ measuring capacitor circuits 50, 52. If the capacitance of $C_{Ref.\,1}$ varies, the voltage of the driving signal will correspondingly vary; however, the current flowing through $L_2$ will remain stable and unchanged.

Note that the DC loop for the current through $L_2$, comprising the reference capacitor signal, flows from ground through $C_{Ref.\,1}$, $D_2$, $L_2$, $L_4$, $R_3$ and into the output of transresistance amplifier 200 which has a very low impedance, and therefore, functions as a ground to complete the loop. The composition of this loop is important as will later become apparent.

Before describing the circuits for the measuring capacitor $C_{+X}$ and $C_{+Y}$, mention should be made of the guard ring circuitry of the circuit which has to this point been ignored. The guard ring is simply an annular capacitor plate 136 insulated from the driven plate 130 of $C_{Ref.\,1}$ and disposed between the driven plate 130 and the substrate 110 as best shown in FIG. 3. The guard ring 136 is disposed opposite to the grounded plate 134 and comprises the driven capacitor plate of the capacitor, $C_{guard\,1}$. Guard ring 136 encircles and overlaps the driven plate 130 of $C_{Ref.\,1}$. As shown in FIG. 3, guard ring 136 linearizes the electric field lines at the edges of driven plate 130 of $C_{Ref.\,1}$ to eliminate the fringe effects of the field lines which would otherwise occur at the plate edges. By linearizing the field lines of $C_{Ref.\,1}$, guard ring 136 equalizes $C_{Ref.\,1}$ with the measuring capacitors $C_{+X}$ and $C_{+Y}$ as will be better explained later on.

Another important function of the guard ring 136 is to shield $C_{Ref.\,1}$ from stray capacitances which would otherwise be present between the driven plate of $C_{Ref.\,1}$ and other charged or conductive surfaces in the vicinity. These stray capacitances could add to the current flowing from $C_{Ref.\,1}$ and lead to measurement inaccuracies if not shielded.

Guard ring 136 is driven through half-wave rectifying diodes $D_3$, $D_4$ in the same way as driven plate 130 is driven through diodes $D_1$, $D_2$. $D_3$, $D_4$ are identical to and provide the same voltage drops as $D_1$, $D_2$, and accordingly, the potential of the guard ring 136 at all times matches the potential of driven plate 130. By maintaining this voltage match, current flow between guard ring 136 and driven plate 130 is prevented and the field lines at the edge of the driven plate 130 are maintained perpendicularly to grounded plate 134. Capacitors $C_1$ and $C_2$ also act as DC blocking capacitors for the guard ring circuit.

The stabilized signal produced by the $C_{Ref.\,1}$ circuit is used to drive the $C_{+X}$ and $C_{+Y}$ circuits 50, 52 as will be now explained. The $C_{+X}$ circuitry 50 will be described as representative of the operation of the $C_{+Y}$ circuitry 52 to avoid duplicity in explanation.

$C_{+X}$ measuring circuitry 50 and measurement signal generation circuitry 70 are shown in FIG. 4. Again, the guard ring 120 and associated diodes $D_{12}$ and $D_{13}$ will be ignored initially. Measuring circuitry 50 of FIG. 4 is identical to the referenced capacitor circuit 40 as a comparison of FIG. 2 with FIG. 4 will reveal. Consequently, as the driving signal increases from its maximum negative value to its maximum positive value, $D_{10}$ charges capacitor $C_{+X}$ which is comprised of sensor plate 112 supported on the bottom of substrate 110 as the driven plate, and object surface 145 as the grounded plate. See FIG. 2C. As the signal falls from its maximum positive value to its maximum negative value, $D_{11}$ conducts to drain charge from $C_{+X}$. This alternate switching on and off of $D_{10}$ and $D_{11}$ causes small equal and oppositely valued DC currents to flow through $L_{10}$ and $L_{11}$ as follows: When $D_{10}$ is conducting, current flows from the output of transresistance amplifier 220 which is effectively grounded due to its very low impedance, through $R_{12}$, $L_{12}$, $L_{10}$, $D_{10}$ and $C_{+X}$ back into ground to complete the loop. Thus the current through $L_{10}$, $I_{L10}$, flows from right to left in FIG. 4 and is considered to be positive. When $D_{11}$ conducts, current flows from ground through $C_{+X}$, $D_{11}$, $L_{11}$, $L_{13}$, $R_{13}$ and into the low impedance output of transresistance amplifier 230 to complete this loop. Hence, the current through $L_{11}$, $I_{L11}$, is left to right in FIG. 4 and is considered to be negative. Note that these loops are symmetric with respect to one another in that each of the loops are comprised of equivalent components. Consequently, the current values through $L_{10}$ and $L_{11}$ while opposite in polarity will be equal in magnitude. The equivalency in magnitude is also the result of the fact that the driving signal is a geometrically symmetric sinusoidal signal as previously mentioned. These small DC currents comprise the measuring capacitor signal for $C_{+X}$. We previously noted that the DC current loop for the reference capacitor signal through $L_2$ flowed from ground through $C_{Ref.1}$, $D_2$, $L_2$, $L_4$ and $R_3$, and back into the output of transresistance amplifier 200. We also noted that the 80 microampere current through $L_2$ corresponds to a separation between the plates of $C_{Ref.1}$ of the nominal distance. Furthermore, we know that the driven plate 112 of $C_{+X}$ is identical to the driven plate 130 of $C_{Ref.1}$ and is fitted with an identical guard ring 120 to linearize field lines at the edge of plate 112. The effect of the linearization of the field lines at the edges of driven plates 112, 130 is to equate the grounded plates 145, 134 of the capacitors $C_{+X}$, $C_{Ref.1}$ by making their dimensions effectively identical. The driven plates 112, 130 for both capacitors are ¼ inch in diameter. The grounded plate for $C_{+X}$ is object surface 145 which is effectively an infinite plate. The grounded plate for $C_{Ref.1}$ is the interior surface 134 of the cap 140 having a diameter of ½ inch. Since the field lines at the edges of driven plates 112, 130 of both of these capacitors are vertical, however, the effective diameter of both of the grounded plates 145, 134 is ¼ inch. Hence, due to the effect of the guard rings 136, 120, at a plate separation of the nominal distance $C_{+X}$ is electrically identical to $C_{Ref.1}$. Consequently, assuming that the separation between the sensor 112 and object surface 145 is the nominal distance, we will get equal and opposite 80 microamp currents through $L_{10}$ and $L_{11}$ since the DC current loops for $L_{10}$ and $L_{11}$ are identical to the DC current loop for $L_2$. As will become apparent, this 80 microamp current level, as set by $C_{Ref.1}$ circuit 40 and signal source circuit 10, and a reference signal (later explained), is the "zero point" for the height of sensor 112 above object surface 145.

To demonstrate that the 80 microamp current level corresponds to the zero point for measuring capacitor $C_{+X}$, as a first condition let us assume that the object surface 145 is lying at precisely the nominal distance below the sensor 112. If this is the case, the current through $L_{10}$ will be +80 microamps as discussed above.

In FIG. 4, this current will flow into measurement signal generation circuit 70. Consequently, if $R_{12}=50$ K ohms, the inverting input to transresistance amplifier 220 will be +80 microamperes and its output will be +4 volts at node 235. We have a fixed reference voltage $V_{Ref.2}$ of 7 volts injecting a "reference signal" current into node 235 through the resistor $R_{10}$ which is a 43.75 K ohm resistor here. A −160 microampere current is generated by this $V_{Ref.2}$ reference voltage through $R_{10}$, and assuming $R_{12}=50$ K ohms, this current imposes a (50 K ohm)(−160 microampere)=−8 volt potential at node 235. The net potential at node 235 is therefore 4 volts −8 volts=−4 volts. This −4 volt potential is present at the inverting input to differential amplifier 240. The equal and opposite −80 microampere current through $L_{11}$ is converted by transresistance amplifier 230 to an output voltage of $V_{TR4}=I_{L11}R_{13}=(-80$ microamperes$)(50$ K ohms$)=-4$ volts, assuming $R_{13}=50$ K ohms. This −4 volt signal is imposed at the noninverting input to differential amplifier 240. Differential amplifier 240 subtracts the −4 volt signal at the inverting input from the −4 volt signal at its noninverting input to get a zero output. This zero output corresponds to the "zero point" for the +X sensor in that it indicates to the control system 80 that the sensor is the nominal distance above the object surface. The $V_{Ref.2}$ reference signal together with the driving signal generated by $C_{Ref.1}$ circuit 40 and signal source circuit 10 combine to set this zero point. Note that the overall operation of the circuitry is to compare the measuring capacitor signal from $C_{+X}$ circuitry 50 to the reference signal supplied by $V_{Ref.2}$. The $V_{Ref.2}$ reference signal imposed at node 235 is representative of the nominal plate separation. Measuring signal generating circuitry 70, thus, compares the measuring capacitor signal with a nominal plate separation reference signal to determine the deviation of the plates of $C_{+X}$ from the nominal distance. Here, since we have assumed that the $C_{+X}$ plates are separated by the nominal distance, we generate a zero deviation signal from circuitry 70.

Assume now that the object surface 145 is positioned closer than the nominal distance such that the capacitance of $C_{+X}$ increases and +82 microamperes flow through $L_{10}$ while −82 microamperes flow through $L_{11}$. Transresistance amplifier 220 will have an output of $V_{TR3}=(+82$ microamperes$)(+50$ K ohms$)=4.1$ volts. At node 235 the potential will be $4.1-8=-3.9$ volts. Thus, −3.9 volts will be present at the inverting input to differential amplifier 240.

Transresistance amplifier 230 on the other hand will have an output of −4.1 volts which will be present at the noninverting input to differential amplifier 240. Differential amplifier 240 will subtract the difference between −4.1 volts and −3.9 volts $=-0.2$ volts and multiply that value by a gain of 50, for example, to obtain an output 242 of −10 volts. This −10 volt output will be interpreted by the control system to indicate that the object surface is a scaled distance closer to the +X sensor than the nominal distance.

Again, the circuitry compares the 82 microampere measuring capacitor signal with the $V_{Ref.2}$ signal representative of nominal plate separation. The output generated by circuitry 70 is, therefore, representative of the deviation in plate separation of the plates of measuring capacitor $C_{+X}$ from the nominal distance.

The circuitry for the $C_{+Y}$ capacitor is identical to, and operates in exactly the same manner as, the circuitry just described for capacitor $C_{+X}$. Thus, circuit 40 for $C_{Ref.\ 1}$ and circuit 10, together with the $V_{Ref.\ 2}$ reference signal, set the same nominal zero point for the $+Y$ sensor 114, and in exactly the same way.

The other two measuring capacitors $C_{-X}$ and $C_{-Y}$ are driven via the lower half of the circuit shown in FIG. 2. With reference to FIG. 2, an identical signal to the signal passing from node 156 upwardly through $R_1$, passes from node 156 downwardly. The signal drives identical circuitry, the only exception being that the secondary coil 184 of transformer 186 is wound in a direction opposite to its primary coil 182, whereas the coils 172, 174 of transformer 170 are both wound in the same direction. The result is that a 180 degree out of phase equal and opposite signal drives $C_{Ref.\ 2}$, $C_{-X}$ and $C_{-Y}$, than drives $C_{Ref.\ 1}$, $C_{+X}$ and $C_{+Y}$. $C_{Ref.\ 2}$ otherwise provides voltage regulation feedback in exactly the same way as described above to generate a geometrically symmetric and stable sinusoidal driving signal for the measuring circuits 54, 56, of $C_{-X}$, $C_{-Y}$. The $C_{Ref.\ 2}$ circuit 42 and signal source circuit 10 produces equal and opposite 80 microampere current levels through the $C_{-X}$, $C_{-Y}$ circuits 54, 156 when the $-X$ and $-Y$ sensors 116, 118 are separated the nominal distance from the object surface 145 in exactly the same manner as was described with reference to the $C_{Ref.\ 1}$ circuit 40.

By driving the $C_{+X}$ and $C_{+Y}$ circuits 50, 52 with an equal but opposite signal to the signal which drives the $C_{-X}$ and $C_{-Y}$ circuits 54, 56, a zero net current is passed through the object surface 145 to ground by the measuring sensors at any given point in time. This constant maintenance of a zero current flow through object surface 145 prevents object surface 145 from developing a voltage potential with respect to ground due to its impedance to ground. This ensures that object surface 145 remains at ground potential even if it has a finite nonzero impedance. It also prevents the object surface 145 from being slightly charged due to dielectric absorption or other effect. Where the object surface 145 is a reticle in an electron beam system, the maintenance of zero net current to ground may be advantageous as will later be explained. In applications where it is not necessary to maintain a net zero current flow from the reticle to ground, the use of a two phase system would not be required and all measuring capacitors could be driven from a single phase RF signal. Consequently, the capacitance height gauge circuit of the present invention is not intended to be limited to a two phase system such as the one disclosed.

Whether or not a two phase system is used, the four sensor measurements, after being processed by the associated measurement signal generation circuitry, are input to the control system 80 to indicate the position of the object surface 145 with respect to the four nominal zero points. The control system can then, in response to this information, either manipulate the position of the object surface, or the position of the tool being used to work on the object surface, for example, as appropriate to the task being performed.

Having described the capacitive height gauge of the present invention in its general form, it will now be explained as an integral part of a system for detecting the position of a reticle 250 in an electron beam lithography apparatus. The many advantages and special features of the gauge will become more apparent from the description of the use of the gauge in this application.

FIG. 5 shows the environment of the capacitance height gauge as applied in an electron beam lithography apparatus. In FIG. 5, the gauge is shown as comprised of the hybrid circuitry on the substrate 110 and the remainder of the circuitry which is denoted as simply "capacitance gauge electronics" 254. The hybrid circuit substrate 110 is secured to the bottom of the electron beam optics housing 258 in an overlying relationship with respect to the chrome-on-glass reticle 250. The reticle 250 is supported on a stage 260 in the vacuum chamber 262 of the apparatus for movement in the X and Y directions under the control of the control system 80. A layer 266 of electron beam resist is deposited over the chromium layer 268 of the reticle as shown. The electron beam 270 passes through a central aperture 111 in the substrate 110 and patterns the beam resist layer 266 with the desired VLSI circuit pattern as the reticle 250 is advanced in the X or Y directions.

In addition to positioning the reticle 250, the control system 80 controls the deflection angle of the electron beam to ensure that it strikes the desired point on the reticle with the high degree of precision required of VLSI circuitry.

Given the high precision required in this art, prior to utilizing the electron beam to write on the reticle 250, the beam 270 must first be calibrated with respect to the current environmental conditions. A calibration plate 280 such as that shown in FIG. 6 is used for this purpose. The calibration plate 280 is secured to the stage 260 adjacent to the reticle 250, and directly below the electron beam optics housing 258. A conductive layer 282 covers the calibration plate 280. A grid 284 of very tiny nonconductive points 286 is formed into layer 282. The grid 284 is comprised of a multitude of equally spaced and symmetrically arranged conductive points 286. Point 290 is centered with respect to the centerline of optics housing 258 by movement of the stage to specified X, Y coordinates. Point 290 is denoted the "origination point." With the cap gauge measuring circuitry turned off, the electron beam 270 is turned on and is sequentially advanced by the control system from one nonconductive point on the grid to the next. The control system 80 senses each sequential nonconductive point and stops when it strikes the desired point 294. The deflection angle A which is necessary to cause the beam to strike precise point 294 is recorded by the control system. Point 294 is located a specified distance "d" from origination point 290 since the geometry of grid 284 is known. The electron beam 270 is now turned off and the cap gauge circuitry is turned on to take calibration plate position readings from the four sensors 112, 114, 116, 118. The associated measurement signal generation circuitry for each sensor determines the position of the calibration plate 280 with respect to the nominal zero point for the sensor and enters this information into the control system 80. A best fit plane is calculated from the four points using well known mathematics. This plane defines the "calibrated plane" for the reticle 250.

Once the calibrated plane has been determined, stage 260 is moved to position reticle 250 under electron beam optics housing 258 as shown in FIG. 7. The point 298 on the reticle 250 directly aligned with the center line of the housing is again denoted as the origination point. The point 300 which is the precise distance d from point 298 is the desired point for writing on reticle 250. The reticle outlined by dotted lines in FIG. 7 is located precisely in the calibrated plane, and hence, the beam 270 would strike point 300 on the dotted reticle using the normal deflection angle A. The actual position of the reticle in FIG. 7, however, is illustrated by reticle 250 outlined in solid lines. In this position the beam 270 would write at point 302 if normal deflection angle A were used.

To avoid such an error, prior to writing on the reticle, reticle position readings are taken by the four sensors 112, 114, 116, 118. These readings are input to the associated measurement signal generation circuits and then to the control system. A best fit plane is calculated for the four points. This plane is known as the "reticle plane." The control system compares the reticle plane with the calibrated plane and determines the deviation. In this case, the control system will determine that the reticle is a precise distance above the calibrated plane and will adjust the electron beam deflection angle from normal deflection angle A to a precise corrected deflection angle B to ensure that the beam writes at the precise point 300 notwithstanding the fact that the reticle 250 is positioned above the calibrated plane. The electron beam then writes or patterns the segment of the circuit included within this stage position and advances the reticle to the next stage position. The reticle position readings are again taken and processed to determine the deviation of the reticle plane from the calibrated plane and appropriate adjustments are made to the beam deflection angle to account for any deviation. This cycle is repeated at each stage position until the reticle is completely patterned, or a change in environmental conditions warrants recalibration of the electron beam.

Having described the capacitance height gauge as applied in the reticle position detection system disclosed, various advantageous features of the invention will now become more apparent. FIG. 8 shows the top surface of the hybrid circuit substrate 110. As was mentioned previously, all of the hybrid circuitry except for sensor plates 112, 114, 116, 118 and the associated guard rings 120, 122, 124, 126 are supported on the upper surface of the substrate. Thus, the reference circuits 40, 42 and identical measuring capacitor circuits 50, 52, 54, 56 are supported on the top of the substrate. Each of these circuits is comprised of four capacitors, four pin diodes and two coils, all of which are discrete components interconnected by signal lines deposited on the substrate. The four circuits 50, 52, 54, 56 feed through to the sensors 112, 114, 116, 118, respectively, and their associated guard rings 120, 122, 126, 128. The two circuits 40, 42 feed directly to their respective driving plates 130 and guard rings 136 on the upper surface of the substrate 110.

Figure 9:
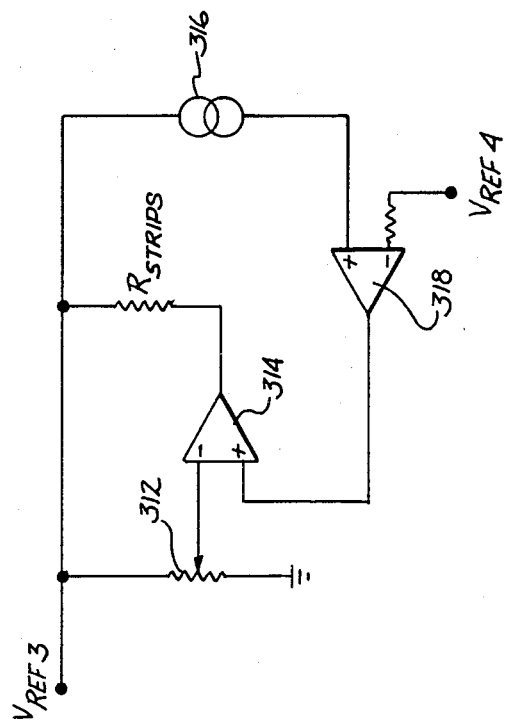
FIG. 9 is a simplified circuit diagram of the temperature control circuitry of the present invention.

The hybrid circuitry carried on the top of the substrate also includes the resistance heating strips 310, shown in FIG. 8, which can be silk screened on the substrate. These strips 310 together comprise the resistor $R_{strips}$ shown in the simplified circuit diagram of FIG. 9 which shows the substrate temperature control circuitry of the invention. The function of these resistive strips is to heat the substrate to a temperature of a few degrees above room temperature and thereby maintain control over the temperature of the hybrid circuit components at all times. With reference to FIG. 9, a rheostat 312 is used to set the desired temperature of the substrate 110. This temperature setting is input as a corresponding voltage, 5 volts for example, on the inverting pin of differential amplifier 314. A substrate temperature sensor 316 scaled to one microampere per degree kelvin outputs a current proportional to the substrate temperature. This current signal is input to the noninverting input of transresistance amplifier 318. The inverting input of the transresistance amplifier 318 is provided with an offset signal, $V_{Ref.\ 4}$, to convert the output of amplifier 318 to degrees Celsius. The amplifier output is applied to the noninverting input of differential amplifier 314 wherein it is compared with the rheostat setting. Where the two inputs are equal, the output voltage of the amplifier provides the required voltage drop across the resistance heating elements $R_{strip}$ to maintain the substrate at the current temperature. If the substrate temperature drops below the desired temperature then the output voltage of differential amplifier 314 decreases to increase the voltage drop across the resistive strips and thereby increase the substrate temperature. Conversely, if the substrate runs too hot the voltage drop across the resistive strips is reduced to cool the substrate. The resistive strips 310 are evenly distributed about substrate 110 to prevent temperature gradients.

By regulating the temperature of the substrate in this way the identical components of the reference and measuring capacitor circuits are maintained at the same operating temperature and the accuracy of the gauge is protected from temperature drifts. Moreover, in that both the reference and measuring capacitors are in the same "measuring environment," the dielectric between the plates of all of these capacitors undergoes the same environmental changes, such as changes in temperature and humidity. Consequently when environmental changes do occur in the vacuum chamber, resulting in a change in the capacitance of the reference and measuring capacitors, the changes are automatically accounted for by the reference capacitor circuits which maintain the current flow through the reference and measuring capacitor circuits at a stable level regardless of environmental changes.

Consequently, current flow through the measuring capacitors varies only with plate separation in that environmental effects are minimized. Another important advantage of the hybrid circuit embodiment disclosed is that the reference and measuring capacitor circuits are not only identical, and subject to the same environmental influences, but in addition, they are subjected to the same environment throughout their operating life. Hence, the circuit components tend to age together at the same rate and in the same manner which further ensures the accuracy of the gauge over time.

A further important aspect of the invention is the fact that the four diodes used in the reference and measuring capacitor circuits are ultra low capacitance PIN diodes. These diodes function as extremely small capacitors in their reversed biased state, and hence, do not contribute to the current flowing through the measuring and reference capacitors. In addition, the capacitance of these diodes remains very small even during wide temperature drifts.

Having described the invention in its presently preferred embodiment, the manner in which the outputs of the four sensors are correlated with plate separation will now be explained.

Figure 10:
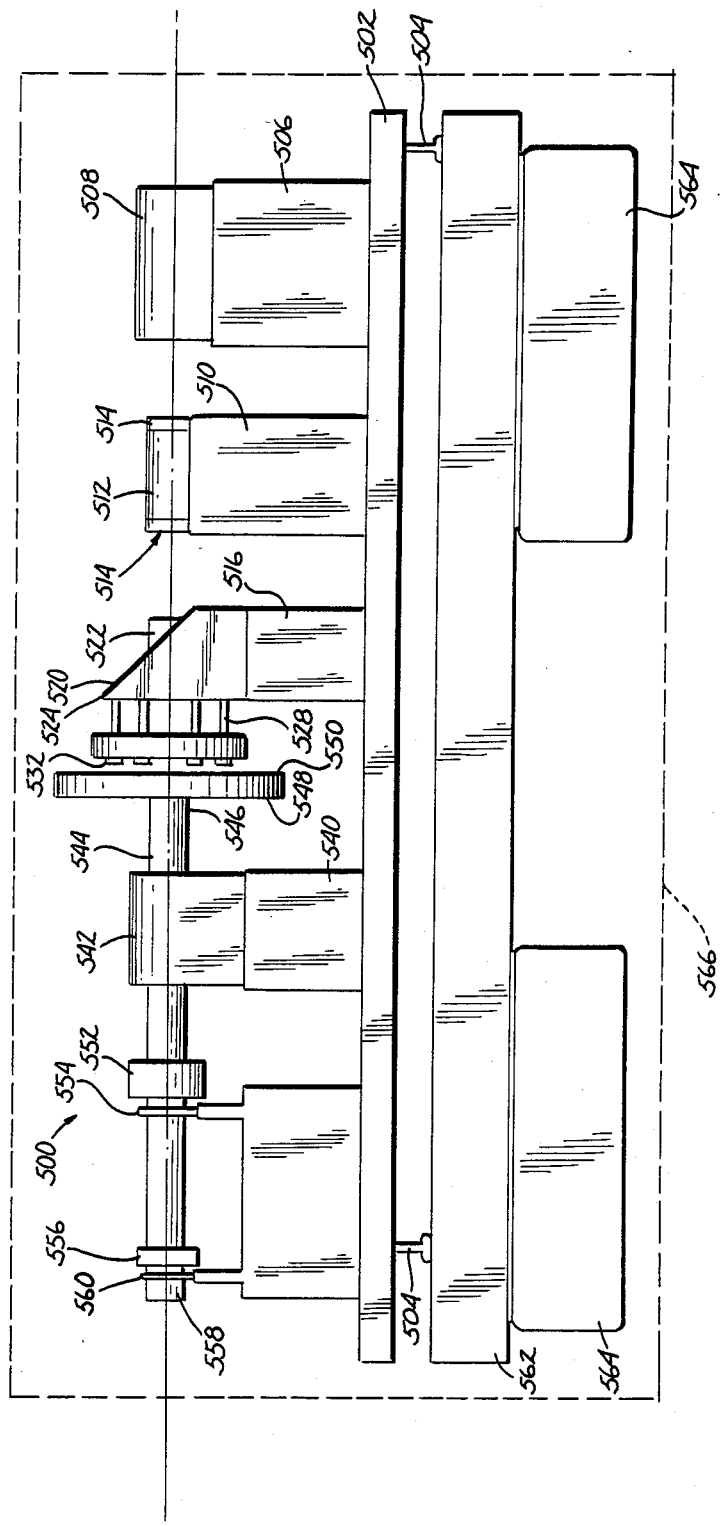
FIG. 10 shows an elevational view of the capacitance height gauge calibration fixture.
Figure 11:
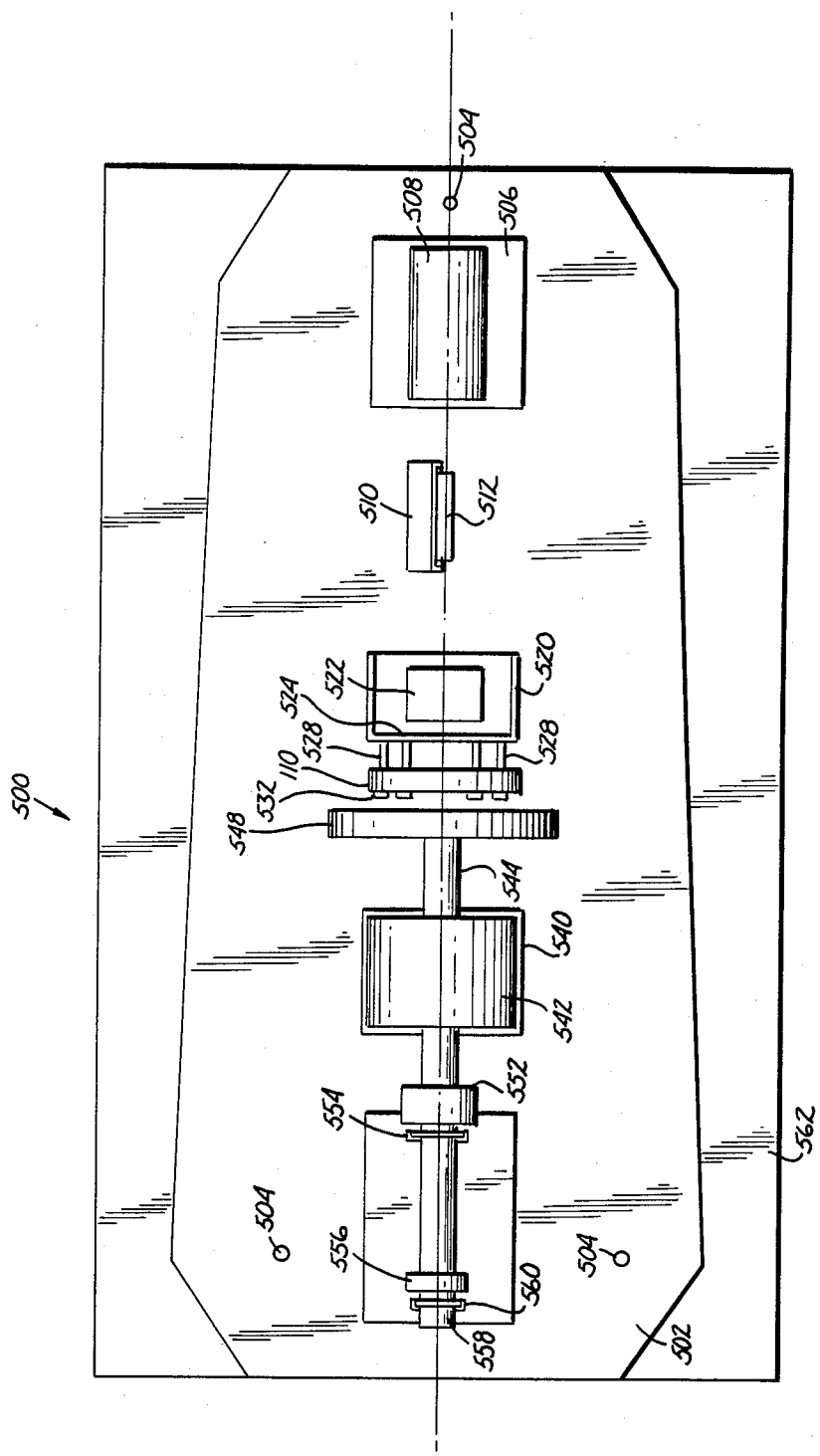
FIG. 11 shows a plan view of the fixture.
Figure 12:
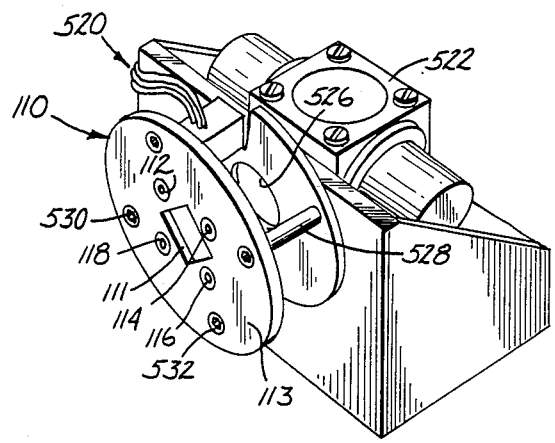
FIG. 12 shows a perspective view of the interferometer cube support member, with the capacitive height gauge substrate secured to its forward face.

FIGS. 10 and 11 show the calibration fixture 500 on which the sensors are calibrated. Fixture 500 has a base 502 and three adjustable supporting legs 504. Legs 504 can be threadably adjusted, for example. Base 502 supports a laser table 506, which in turn supports a laser 508. A vertically upstanding member 510, supported by base 502, supports a laser receiver 512. Laser receiver 512 is secured to member 510 by screws 14, for example. A support block 516, supported by base 502, supports an interferometer cube support member 520, which is best shown in FIG. 12. Support member 520 supports the interferometer cube, or prism, 522, behind a verticle wall 524. Wall 524 has a large aperture 526 through which the laser beam projects as will later become apparent. Four internally threaded posts 528 project orthogonally from the front side of wall 524, as shown. The cap gauge substrate 110 is threadably secured by screws 530 to the posts 528. Each screw is counter-sunk within a precisely-machined washer 532. By mounting the substrate 110 in this way, it is intended that the substrate's surface will lie in a plane substantially perpendicular to the path of the laser beam. Note that the central aperture 111 of substrate 110 aligns with the aperture 526 of wall 524 and also permits the passage of the laser beam. It is noted that the portion of the calibration fixture so far described, comprised of the laser 508, the laser receiver 512, and the interferometer cube 522, together with laser electronics (later described) are all commercially available as a package from Hewlett-Packard as a laser interferometer, Model No. HP5501A, having a resolution of 5 nanometers. These components together comprise the laser interferometer assembly and can measure precise distances in a manner later described.

Note that all components of the laser assembly are rigidly secured to the fixture 500. The portion of the calibration fixture 500, which will next be described, comprises an assembly which movably positions a mirror, or dummy reticle, with respect to the laser assembly.

A support table 540 supports an air bearing 542. Air bearing 542 supports a longitudinally directed shaft 544 for very low friction rectilinear movement. End 546 of shaft 544 rigidly supports a mirror support member 548, which in turn supports the mirror 550 in a vertical orientation, directly opposite to the sensors 112, 114, 116, 118 of cap gauge substrate 110. The mirror surface is electrically conductive in that it functions as one plate of a measuring capacitor, as will be later described. A drive magnet 552 is supported by shaft 544 on the opposite side of air bearing 542 from the mirror 550. Magnet 552 is reciprocally driven by voice coil 544, which encircles shaft 544 and is rigidly supported by table 540. A velocity damping magnet 556 is secured at the end 558 of shaft 544. A velocity sensing coil 560 encircles the shaft 544 adjacent to magnet 556 and is rigidly supported by table 540. Drive coil 544 is energized in a manner later described to drive the mirror 550 to the desired location with respect to the sensors 112, 114, 116, 118. Velocity damping magnet 556 moves with shaft 544, and as it moves, it generates a voltage across the velocity sensing coil 560. This voltage is used as a velocity damping signal in a manner which will also be later described.

In order to provide vibration isolation for the calibration fixture 500, the support legs 504 can rest upon a massive granite block 562, which in turn can be supported by air bags 564. In addition, the entire fixture can be installed in a temperature controlled environment 566.

Having described the basic structure of the calibration fixture, its operation will now be described with reference to the partially schematic, functional block diagram shown in FIG. 13.

As noted above, the laser interferometer assembly, comprised of the laser 508, interferometer cube 522, laser receiver 512, and laser electronics 570, is commercially available as a package to very precisely measure small distances. In this case, the laser interferometer assembly is used to determine the distance between the sensors 112, 114, 116, 118 and the surface of the mirror 550. The interferometer assembly is used in the present invention in that it is the best "yardstick" available for determining the distance between the sensors 112, 114, 116, 118 and the mirror 550.

Briefly, the laser beam generated by laser 508 passes through interferometer cube 522 and is reflected off of mirror 550 back to the laser receiver 512. The laser receiver 512 indicates to laser electronics 570 the position of mirror 550. Laser electronics 570 is advised, in a manner later described, of the desired position of the mirror and utilizes the input from laser receiver 512 to determine the differential distance between the actual position of mirror 550 and its desired position. Laser electronics 570 then outputs this differential distance as an error signal. The use of this error signal by the present apparatus to control the position of mirror 550 will be described shortly.

Figure 13:
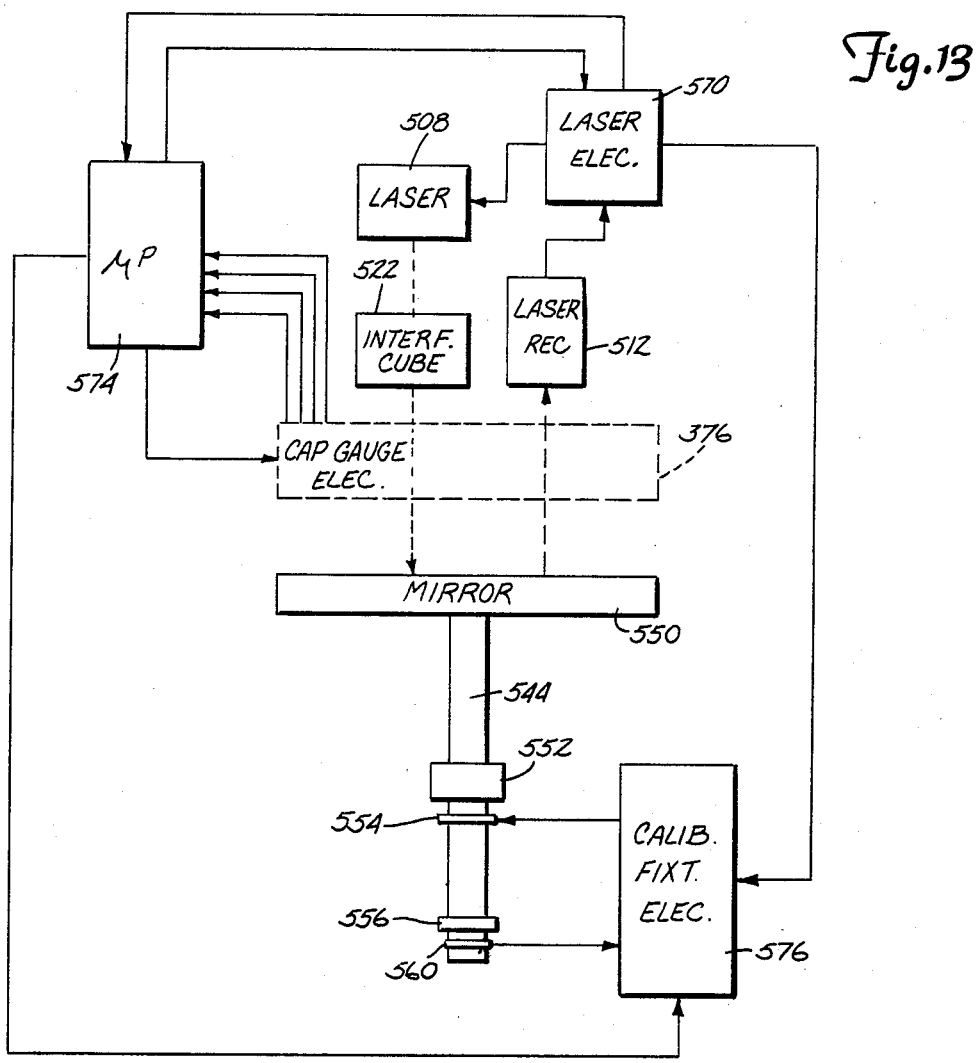
FIG. 13 shows a partially schematic, functional block diagram of the calibration system.

With reference to FIG. 13, to begin the calibration procedure, microprocessor 574 instructs the calibration fixture electronics 576 to energize drive coil 554 to drive mirror 550 into abutment with the four machined washers 532, which are secured to substrate 110, as previously described. The thickness of washers 532 is very accurately machined so that the mirror 550 is positioned 20 milliinches from the sensors 112, 114, 116, 118. Microprocessor 574 now tells laser electronics 570 that the mirror should be moved an additional 40 milliinches away from the sensors 112, 114, 116, 118. Laser receiver 512 tells the laser electronics 570 where the mirror's present position is, and laser electronics 570 generates an error signal representative of the distance between actual position of the mirror 550 and its desired location. This error signal is input to calibration fixture electronics 576, which in response thereto, energizes drive coil 554 to drive mirror 550 back towards the desired position. As the mirror moves away from the sensors 112, 114, 116, 118, the laser receiver 512 constantly monitors its position and the error signal generated by laser electronics 570 is correspondingly reduced as the mirror 550 moves closer and closer to the desired location. As the mirror moves, the velocity damping magnet 556 moves with respect to the velocity sensing coil 560, and a voltage is generated across the coil 560 in proportion to the speed of the magnet 556. This velocity signal is input to the calibration fixture electronics 576 as a velocity damping signal to prevent oscillation of the mirror about the desired location in a manner more fully described later on. Once the mirror reaches the desired position, a "zero error signal" is output from laser electronics 570, and calibration fixture 576 controls drive coil 554 to stop mirror 550 at the desired location. At this time, laser electronics 570 indicates to microprocessor 574 that mirror 550 has reached the desired location which is 60 milliinches from the sensors 112, 114, 16, 118 in this initial situation. Microprocessor 574 now takes voltage readings from the four sensors 112, 114, 116, 118 and stores this information for each sensor for this initialization point of 60 milliinches. Microprocessor 574 then directs laser electronics 570 to move the mirror to a first sample point 5 milliinches, for example, from the initialization point. Laser electronics 570 again generates an error signal representative of the 5 milliinch distance between the actual position of the mirror and the new desired location and this error signal is again used by calibration fixture electronics 576 to drive mirror 550 to the new desired location. When the location is reached, a zero error signal is again generated by laser electronics 570 and in response thereto calibration fixture electronics stops the mirror 550 and microprocessor 574 again samples the four sensors 112, 114, 116, 118. The voltage reading for each sensor 112, 114, 116, 118 is stored by microprocessor 574 for this new location. The mirror is then moved in accordance with the control program of microprocessor 574 to the next sample point by the same procedure and these sensors are again sampled at this new location. Obviously, sensor readings for any desired number of sample points can be obtained in this way. Microprocessor 574 stores this information in the form of a table, listing the voltage readings for each sensor at each sample point. In this way, the sensors can be calibrated over a range of plate separation distances.

Having described the overall operation of the calibration system of FIG. 13, calibration electronics 576 will now be described in somewhat more detail with reference to FIG. 14.

Figure 14:
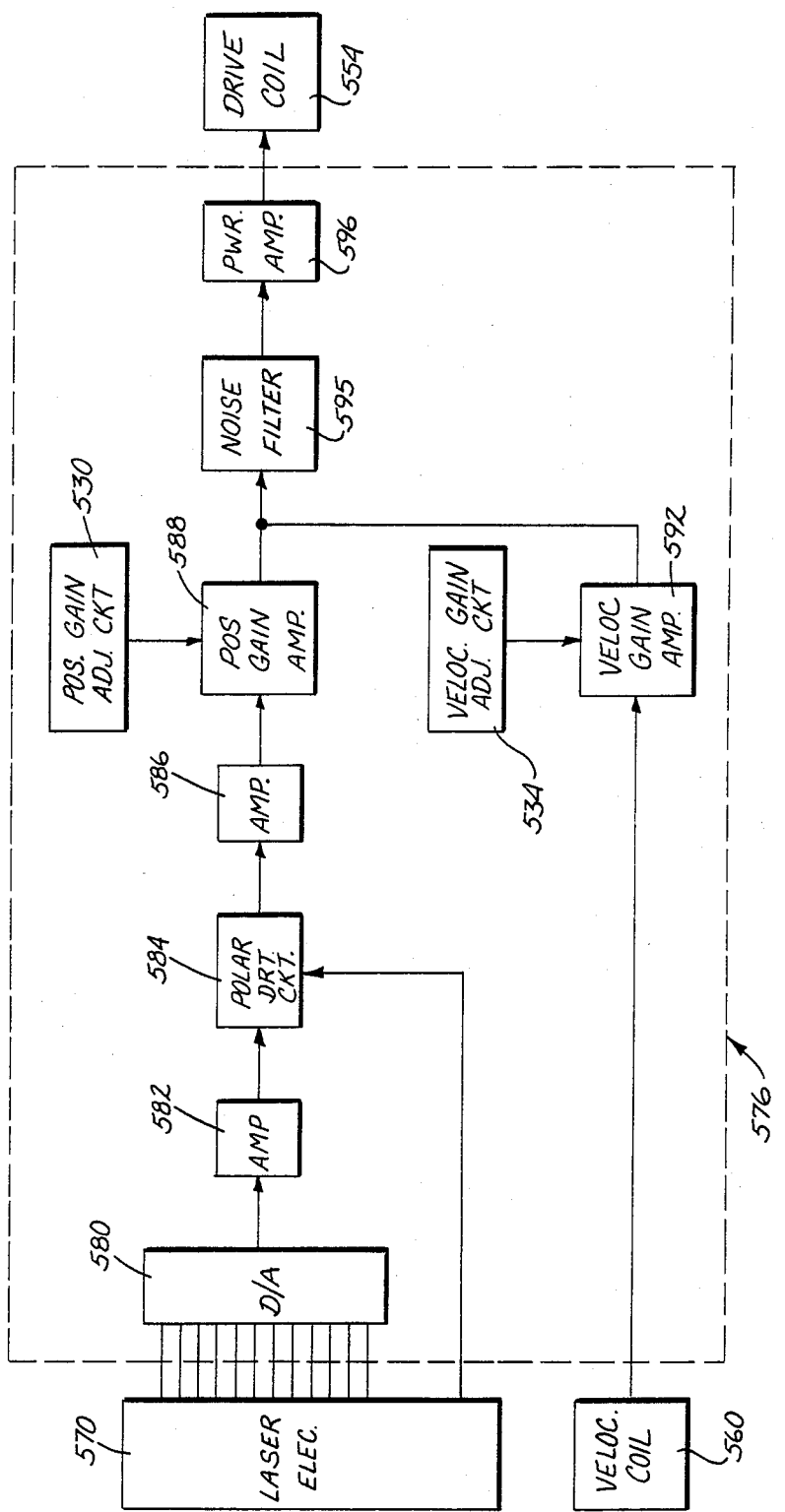
FIG. 14 shows a functional block diagram of the calibration fixture electronics.

As shown in FIG. 14, the error signal is delivered to a digital-to-analog converter 580 in the form of a 12-bit digital word directly from laser electronics 570. The analog signal produced by digital-to-analog converter 580 is then scaled by amplifier 582 to a 0–10 volt scale before being delivered to polarity determining circuit 584. Laser electronics 570 also outputs a "direction bit" which is delivered to polarity determining circuit 584, as shown. The direction bit indicates the polarity of the error signal. That is, it indicates which side of the desired location mirror 550 is currently located on so that mirror 550 can be driven in the proper direction. The direction bit is processed by polarity determining circuit 584 to assign the proper polarity to the error signal before it is input to amplifier 586. Amplifier 586 then scales the error signal between 0 to +10 volts, if the assigned polarity is positive, or between 0 to −10 volts, if the assigned polarity is negative. The error signal is then input to position gain amplifier 588. The position gain is adjustable by position gain adjusting circuit 590, which may, for example, comprise a potentiometer positioned in the feedback loop of amplifier 588. Additional damping is provided by velocity coil 560. The signal generated by coil 560 is input to velocity gain amplifier 592. A velocity gain adjusting circuit 594 is provided to permit adjustment of the gain characteristics of amplifier 592, and may also comprise a potentiometer positioned in the feedback loop of amplifier 592. The gain adjusting circuits 590 and 594 are adjusted together to stabilize the circuit and prevent oscillation of mirror 550, or ringing, about the desired location. The signals from amplifiers 588 and 592 are summed before finally being filtered at noise filter 596, and then finally amplified at power amplifier 598 to attain the necessary power level to drive the drive coil 554.

The entire calibration fixture 500 is contained in a temperature-controlled environment which may also be under the control of microprocessor 574. Likewise, the cap gauge substrates temperature control circuit shown in FIG. 9 may also be under the control of microprocessor 574. Microprocessor 574 will generally maintain the environmental temperature a few degrees cooler than the substrate temperature so that temperature gradients in the substrate are avoided. The environment and substrate temperatures may be varied by microprocessor 574 according to its control program to generate sets of calibration data at various temperatures. When the capacitance gauge is then later used in an electron beam apparatus, for example, the appropriate set of calibration data for the temperature at which the apparatus will be used can be utilized.

An important aspect of the present invention is that after a particular capacitance gauge has been out in the field for a period of time, it can be recalibrated on calibration fixture 550. For recalibration, the substrate is simply reinstalled in the fixture 500, and run through the same calibration procedure as just described. The results of the calibration process will indicate whether the sensor readings have varied with time or have remained the same.

It should be noted that the intialization point described above may not be exactly 60 milliinches from the sensors, but rather is nominally 60 milliinches from the sensors 112, 114, 116, 118. The principal reason for this is that, although the washers 532 are finally machined to a 20 milliinch thickness, in that they are a mechanical part, it is expected that there will be some actual variation from an exact 20 milliinch dimension. Consequently, when the mirror is first placed into abutment with the washers 532, it may or may not be precisely 20 milliinches from the sensors 112, 114, 116, 118. Therefore, when it is backed up 40 milliinches by the microprocessor 514, the initialization point will only be a nominal 60 milliinches from the sensors rather than necessarily an exact 60 milliinch distance from the sensors. As the mirror is moved in 5 milliinch increments, however, the incremental distances will be separated by precisely 5 milliinches to the accuracy of the laser interferometer assembly, which is far more accurate than any mechanical measuring technique. Consequently, although the initialization point may not be exactly 60 milliinches from the sensors, we know that the subsequent test points can be stepped off in precise 5 milliinch increments to the accuracy of the laser interferometer. Moreover, it is these "difference readings" between the various points, which are of most concern to us. This is particularily true in the present application, for example, wherein the capacitance gauge is being used to measure the difference between the distance to the reference plane and the distance to the reticle. Such distance differences can be measured very accurately by the instant apparatus, and accordingly, fine adjustments can be made to the electron beam apparatus to correct for the actual position of the reticle.

Having disclosed the presently preferred embodiments of the invention, many modifications and variations thereof will be obvious to those skilled in the art. Particularly, others will recognize that the calibration fixed apparatus disclosed for calibrating capacitance height gauges may be applicable to the calibration of other types of capacitive height gauges than the one particularly disclosed herein. Accordingly, the present invention is intended to be limited only by the scope of the appended claims.

What is claimed is:

1. An apparatus for calibrating a capacitance height gauge having a capacitive sensor, comprising:
   a base;
   a laser interferometer assembly supported by said base;
   an electrically conductive mirror movably supported on said base opposite to said laser assembly;
   a means for supporting said capacitance gauge with said sensor oppositely disposed with respect to said mirror; and a means for moving said mirror with respect to said laser interferometer, wherein said moving means positions said mirror a desired location from said sensor such that said sensor forms a capacitor with said mirror, and wherein said laser interferometer assembly is utilized to determine the distance between said sensor and said mirror, further comprising a means for obtaining an electrical reading from said capacitor comprised of said sensor and said mirror while said mirror is positioned at said desired location.

2. The apparatus of claim 1, further comprising a computer control system, and wherein said laser interferometer assembly includes a laser electronics circuit, said computer control system indicating to said laser electronics circuit a desired position for said mirror, and said laser electronics circuits, in response thereto, generating an error signal representative of the differential distance between the actual position of said mirror and said desired position of said mirror.

3. The apparatus of claim 2, further comprising a calibration fixture electronics circuit, said calibration fixture electronics circuit controlling said moving means in response to said error signal generated by said laser electronics circuit to move said mirror to said desired location.

4. The apparatus of claim 3, wherein said laser interferometer assembly also includes a laser, an interferometer cube, and a laser receiver, said laser emitting a laser beam through said interferometer cube to said mirror, said laser beam being reflected off of said mirror to said laser receiver, said laser being controlled by said laser electronics circuit, said laser receiver providing an input to said laser electronics circuit indicating the distance to said mirror, said laser electronics circuits utilizing said distance input to generate said error signal.

5. The apparatus of claim 3 further comprising a means for sensing the velocity of said mirror, said velocity sensing means providing an input to said calibration fixture electronics circuit, said calibration fixture electronics circuit processing said mirror velocity input to provide damping of said mirror movement by said moving means.

6. The apparatus of claim 5 wherein said calibration fixture electronics circuit further comprises a position gain circuit and a velocity gain circuit.

7. The apparatus of claim 6 wherein the output of said position gain circuit is combined with the output of said velocity gain circuit to damp the movement of said mirror to prevent oscillation of said mirror about said desired point.

8. The apparatus of claim 3 wherein said error signal includes an indication of the polarity of said error signal, and wherein said calibration fixture electronics includes a means for processing said polarity indication to apply the proper polarity to said error signal before said error signal is applied to said moving means to ensure that said moving means moves said mirror towards said desired location.

9. The apparatus of claim 3 wherein said moving means comprises a shaft supported in an air bearing, said mirror being mounted at one end of said shaft, said moving means including means to move said shaft and said mirror in response to said error signal.

10. The apparatus of claim 9 wherein a drive magnet is rigidly secured to said shaft, and a stationary drive coil encircles said shaft proximate to said drive magnet, said calibration fixture electronics processing said error signal to provide a drive signal of the proper polarity to said drive coil to either repel or attract said drive magnet in order to drive said mirror to said desired location.

11. The apparatus of claim 10 further comprising a velocity damping magnet rigidly secured to said shaft, and a stationary velocity sensing coil encircling said shaft proximate to said velocity damping magnet, a voltage being generated across said velocity sensing coil as said velocity damping magnet is moved with respect to said velocity damping coil, said voltage comprising a velocity damping signal, said velocity damping signal being input to said calibration fixture electronics, said calibration fixture electronics processing said velocity damping signal to damp the movement of said mirror to prevent oscillation of said mirror about said desired location.

* * * * *